US012571857B2

(12) United States Patent
Steffens et al.

(10) Patent No.: US 12,571,857 B2
(45) Date of Patent: Mar. 10, 2026

(54) CABLE, DEVICE AND SYSTEM

(71) Applicant: Rohde & Schwarz GmbH & Co. KG, Munich (DE)

(72) Inventors: Johannes Steffens, Munich (DE); Thomas Braunstorfinger, Munich (DE)

(73) Assignee: Rohde & Schwarz GmbH & Co. KG

( * ) Notice: Subject to any disclaimer, the term of this patent is extended or adjusted under 35 U.S.C. 154(b) by 213 days.

(21) Appl. No.: 18/311,099

(22) Filed: May 2, 2023

(65) Prior Publication Data

US 2024/0369645 A1 Nov. 7, 2024

(51) Int. Cl.
| | |
|---|---|
| *G01R 31/58* | (2020.01) |
| *G06F 13/38* | (2006.01) |
| *H01B 11/20* | (2006.01) |

(52) U.S. Cl.
CPC ............. *G01R 31/58* (2020.01); *G06F 13/38* (2013.01); *H01B 11/20* (2013.01)

(58) Field of Classification Search
CPC ................................. G01R 31/58; G06F 13/38
See application file for complete search history.

(56) References Cited

U.S. PATENT DOCUMENTS

| | | | |
|---|---|---|---|
| 2005/0215119 A1* | 9/2005 | Kaneko | G06K 7/10336 439/607.01 |
| 2018/0048097 A1* | 2/2018 | Misgen | G01R 5/00 |
| 2020/0049749 A1* | 2/2020 | Gallhauser | G01R 27/2688 |
| 2022/0194236 A1* | 6/2022 | Whiting | B60L 53/64 |

OTHER PUBLICATIONS

PRY-ID "The Intelligent Cable" <http://pryid.com/the-intelligent-cable/> [retrieved Jun. 26, 2023], 5 pages.

* cited by examiner

*Primary Examiner* — Alesa Allgood
(74) *Attorney, Agent, or Firm* — CHRISTENSEN O'CONNOR JOHNSON KINDNESS PLLC

(57) ABSTRACT

The present disclosure relates to a cable for being connected to a device. The cable includes an input interface, a memory and an output interface. The input interface is connected to the memory. The output interface is also connected to the memory. The memory is capable of storing at least one parameter of the cable, which is input via the input interface. The output interface is capable of accessing the at least one parameter stored in the memory and outputting the at least one parameter. Moreover, a system and a device are disclosed.

1 Claim, 2 Drawing Sheets

CABLE, DEVICE AND SYSTEM

FIELD OF THE DISCLOSURE

Embodiments of the present disclosure relate to a cable for being connected to a device. Further, embodiments of the present disclosure relate to a system with a device and a cable for being connected to the device. Moreover, embodiments of the present disclosure relate to a device for being connected to a cable.

BACKGROUND

In the state of the art, test and measurement systems are known that comprise test and measurement equipment that are connected with a cable, for instance to a sensor via a cable.

The cable typically has certain properties that can be defined by a parameter of the cable. For instance, the cable may be of a certain type, for instance an optical cable, a coaxial cable or a hybrid cable. Further, characteristics like a usable frequency range, a frequency response of the cable, an attenuation of the cable, an electrical length of the cable, a delay or a torque to be applied for connecting purposes may relate to such properties of the cable. In complex test and measurement systems, further passive devices may also be used that have similar characteristics.

Usually, an operator of the test and measurement system has to manually consider the respective properties of the cable when setting up the test and measurement system in order to ensure that the respective components of the test and measurement system match with each other. In other words, a test and measurement device has to be tuned to the respective cable connected thereto in order to ensure proper functionality of the entire test and measurement system.

In addition, it is necessary that the operator also manually checks the setup in order to identify whether components of the test and measurement system are connected in the intended manner.

However, these manual steps require high efforts and, therefore, the costs related thereto are high.

Accordingly, there is a need for a higher degree of automation in order to reduce the overall costs.

SUMMARY

Embodiments of the present disclosure provide a cable for being connected to a device. In an embodiment, the cable comprises an input interface, a memory and an output interface. The input interface is connected to the memory. The output interface is also connected to the memory. The memory is capable of storing at least one parameter of the cable, which is input via the input interface. The output interface is capable of accessing the at least one parameter stored in the memory and capable of outputting the at least one parameter.

Further, embodiments of the present disclosure provide a device for being connected to a cable. In an embodiment, the device comprises an input interface, a memory and an output interface. The input interface is connected to the memory. The output interface is also connected to the memory. The memory is capable of storing at least one parameter of the cable and/or the device, which is input via the input interface. The output interface is capable of accessing the at least one parameter stored in the memory. Further, the output interface is also capable of outputting the at least one parameter.

The main idea is to provide the at least one parameter of the cable associated with properties of the cable in an electronic format such that the parameter can be accessed automatically, for instance by the device to which the cable is connected. In a similar manner, the parameter of the (passive) device can be accessed automatically, for instance by a different device. The parameter of the (passive) device may relate to properties of the (passive) device.

Generally, the cable or the device has the respective output interface via which the at least one parameter can be output in order to be processed further by a device connected thereto, namely a processing device having a processor circuit like a test and measurement device, e.g. a device capable of performing tests and measurements on a device under test.

In some embodiments, the cable or the (passive) device comprises electronics like the memory in order to store the information/data concerning the properties of the cable or the device, namely the at least one parameter. The respective data/information, namely the at least one parameter, can be made accessible on demand or be accessible any time.

In some embodiments, any processing device, e.g. an active device having one or more circuits, that is connected to the cable can obtain the respective information about the cable from the cable itself, namely the memory encompassed in the cable, which comprises the at least one parameter of the cable. In a similar manner, any processing device, e.g. an active device having one or more circuits, that is connected to the (passive) device can obtain the respective information about the cable and/or the (passive) device from the (passive) device itself, namely the memory encompassed in the (passive) device, which comprises the at least one parameter of the cable and/or the (passive) device.

In any case, it is not necessary that the information/data concerning the properties of the cable and/or the (passive) device, namely the at least one parameter, is input manually when configuring/setting up the entire test and measurement system. Consequently, tests and measurements can be performed with a higher degree of automation.

In some embodiments, the at least one parameter is input via the input interface, for instance from a specification of the cable/device or determined manually, e.g. by performing a measurement on the cable/device.

According to an aspect, the cable, for example, has a first connection interface and a second connection interface which are connected with each other by a signal line. At least, the signal line is encompassed by a sheath. Hence, the cable relates to a typical cable that has two connection interfaces at its ends, for instance two plugs or two sockets or a plug and a socket, via which the cable can be connected to different devices, for example different types of devices, such as a test and measurement device and a sensor or a test and measurement device and a (passive) device.

Data and/or information can be transferred via the connection interfaces and the signal line. For instance, the cable is a radio frequency (RF) cable that is used to transfer radio frequency signals via the connection interfaces and the signal line.

In some embodiments, the sheath also encompasses the input interface, the memory and/or the output interface. Therefore, the input interface, the memory and/or the output interface are integrated within the cable, namely the sheath.

The input interface and/or the output interface may be configured to transfer the at least one parameter at least partially via the signal line, for instance by modulating a (radio frequency) signal forwarded via the signal line. Accordingly, the data/information about the at least one parameter can be transferred on the same signal line by modulating it with the measurement data that is typically transferred with the radio frequency (RF) signal via the signal line.

For instance, a time multiplexed signal or a frequency multiplexed signal may be generated that comprises the data/information of the signal forwarded via the signal line as well as data/information about the at least one parameter stored in the memory.

Generally, optical, audio or other suitable data transmission techniques may be used for transferring data/information corresponding to the at least one parameter stored in the memory, which do not interfere with the signal transferred via the connection interfaces and the signal line, namely the radio frequency signal.

Alternatively, the input interface and/or the output interface are formed separately with respect to the connection interfaces. Hence, an additional wired connection may be established between the input interface and/or the output interface and the device with which the cable is connected.

Moreover, the input interface and/or the output interface may relate to a wireless interface.

In some embodiments, the at least one parameter of the cable/device may be at least one of a type of cable, a frequency range, a frequency response, an attenuation, an electrical length, a delay and a torque for connecting purposes. Therefore, different properties/characteristics of the cable and/or the device may be stored in the memory such that this information can be used for configuring the test and measurement system in an appropriate manner.

According to a further aspect, the cable or the device comprises, for example, a sensor that is capable of sensing an environmental parameter, e.g. an environmental parameter of the cable or the device. For instance, temperature, humidity, air pressure, particle radiation and/or strain or other environmental parameters may be sensed by the respective sensor.

In some embodiments, the parameters stored in the memory, for example the ones mentioned above, may be stored depending on the environmental parameter, namely temperature- and/or humidity-dependent. Therefore, the sensed environmental parameter may be taken into account in order to obtain the corresponding value of the parameter for the sensed environmental parameter. The respective value of the parameter is forwarded to the output interface for being output.

Accordingly, it can be ensured that environmental factors having an effect on the entire test and measurement system can be compensated accordingly.

In general, the cable or the device may comprise different sensors for the different environmental parameters, namely a temperature sensor, a humidity sensor, a pressure sensor, a particle radiation sensor and/or a strain sensor.

Another aspect provides that the cable or the device has, for example, a counter capable of counting the number of connections established, e.g. connections established with the cable or the device. Therefore, wear can be estimated by the number of established connections counted, as each new connection causes stress or wear to the cable/device, for example the respective connection interfaces. Based on the number of connections counted, a life cycle or quality of the cable/device may be determined, which is taken into consideration when configuring the test and measurement system automatically.

In some embodiments, the memory is an Erasable Programmable Read-Only Memory (EPROM) or an Electrically Erasable Programmable Read-Only Memory (EEPROM). These types are small such that they can be easily integrated within the cable or the (passive) device. Furthermore, these types ensure that the at least one parameter can be stored electrically while being accessed electrically as well.

Another aspect provides that the input interface and the output interface are established, for example, by a single communication interface. In some embodiments, a bidirectional communication interface is provided for establishing both the input interface and the output interface. The single communication interface may be a wireless communication interface. Therefore, the number of different components used can be reduced, thereby reducing the overall amount and size of the additional components to be integrated into the cable or the device.

For instance, the single communication interface is a Near Field Communication (NFC) interface. Such interface can be implemented easily.

In some embodiments, the device may be a splitter, a measurement bridge, a combiner, a filter, a directional coupler, a diplexer, a duplexer, a multiplexer, a switch, a reflector, a phase shifter or a waveguide. Therefore, different passive devices may also comprise the memory as well as the input interface and the output interface, wherein the at least one parameter of the cable/device is stored in the respective memory integrated in the passive device.

In addition, embodiments of the present disclosure also provide a system with a device and a cable as described above. The above-mentioned advantages also apply to the system in a similar manner.

For instance, the system is a test and measurement system wherein the device is a test and measurement device, also called test and measurement equipment.

An aspect provides that the device comprises, for example, a smart connector. In some embodiments, the smart connector may automatically obtain the information of the cable. For instance, the output interface of the cable may be configured to automatically forward the at least one parameter to the device once a connection is established. The device may have a corresponding reception interface. Thus, the at least one parameter is forwarded like a push notification without requesting its transfer previously.

Another aspect provides that the device, for example, is capable of obtaining the at least one parameter of the cable via the output interface. The device may have a read-out interface that connects to the output interface of the cable such that the at least one parameter is read out from the memory. Hence, the smart connector may automatically read out the memory of the cable.

Further, the device may be capable of configuring an internal setting based on the at least one parameter of the cable. Thus, an internal configuration of the device may be set appropriately due to the at least one parameter obtained from the cable. For instance, attenuation, frequency response and/or mismatch are compensated based on the respective configuration made.

In some embodiments, the device is a robot. The robot can automatically identify a correct cable to be connected while gathering the at least one parameter stored in the cable in order to identify the cable based on the information stored in the memory of the cable.

For instance, the robot has a torque wrench that is capable of matching a torque based on the at least one parameter of the cable. Thus, the robot can automatically determine whether the connections are made correctly, namely with the correct torque. In case of identifying an incorrect correction made, the robot may automatically connect the cable to the device in a correct manner, namely by using the torque wrench in order to apply the correct torque as stored in the memory.

In case one of the devices of the system is a robot, an automated lab can be provided. In some embodiments, the robot may identify cables based on the at least one parameter stored in the cables while assigning the cables to connections to be made and create the respective connections according to specifications, e.g. the torque stored in the memory of the cable. In some embodiments, different cables may be provided in a magazine where the cable data can also be obtained, e.g. read out. Thus, the robot always knows where to find the right cable.

A measurement setup comprising information about the cabling of the components of the test and measurement system may be forwarded to the robot. Hence, the robot receives the information which cable shall be used for interconnecting certain components. Based on the information, the robot is enabled to identify the correct cable out of several cables, e.g. the cables provided in the magazine.

For instance, the magazine may have at least one (bidirectional) interface capable of obtaining the information/data stored in the memory of the cable, namely the at least one parameter of the cable, and/or capable of providing the information to the robot, for example the smart connector. The magazine may also comprise a memory for at least temporarily storing the information/data about the at least one parameter.

In general, the cable and/or the (passive) device comprises the memory, namely additional electronics, to store the information about its properties, e.g. the at least one parameter. The input interface ensures that the information about the properties can be stored in the memory. The output interface connected to the memory makes the at least one parameter available, for instance upon request. Each test and measurement device can query the cable data of the connected cable, namely the at least one parameter of the cable, or the device data of a connected (passive) device, namely the at least one parameter of the device.

Since the output interface may be a wireless interface, the data/information about the at least one parameter can be retrieved at short notice. The ongoing test/measurement is not affected by retrieving the data/information about the at least one parameter from the memory via the output interface.

In the entire test and measurement system, for example a system comprising several devices and several cables, it is ensured that each (processing) device is enabled to obtain the data/information about the at least one parameter of a cable/device connected to it.

Generally, the output interface of a cable/device may forward information/data about the at least one parameter stored in its memory to an adjacent cable/device connected thereto via the input interface of the adjacent cable/device. The respective connection may however be established by separately formed connection interface, e.g. sockets and/or plugs.

In some embodiments, the adjacent cable/device may store the information/data about the at least one parameter obtained via its input interface.

Accordingly, the different devices and/or cables of the system may be connected with each other in series and/or in parallel such that measurement data can be forwarded among the components of the system.

In addition thereto, a data/information transfer chain is established via the input interfaces and the output interfaces of the cables/devices of the system.

This generally ensures that information is obtained which components are interconnected with each other. Consequently, information about the components of the entire test and measurement system can be obtained automatically and remotely. In other words, the overall test and measurement system is automated and verifiable without human interaction, as all devices and cables report what they are connected to.

The respective data/information made accessible can be used for self-configuration of the components of the test and measurement system, for example configuring test and measurement devices automatically based on the components connected thereto, wherein this information is obtained from the at least one parameter stored in the memory integrated within the respective cable/device.

This may result in an automatic and remote control of the entire test and measurement system.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
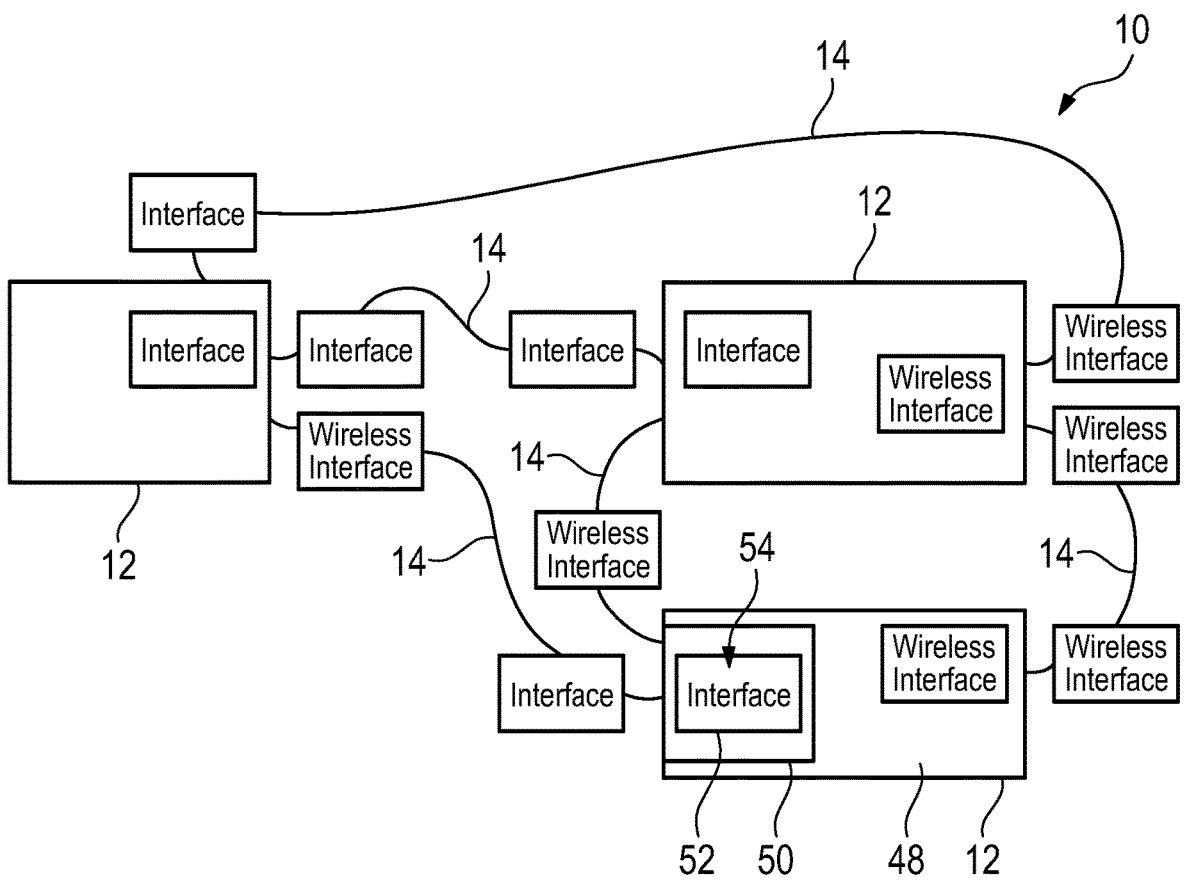
FIG. 1 schematically shows an overview of a system according to an embodiment of the present disclosure which inter alia comprises a cable according to an embodiment of the present disclosure as well as a device according to an embodiment of the present disclosure, FIG. 2 schematically shows an overview of a cable according to an embodiment of the present disclosure, FIG. 3 schematically shows an overview of a device according to an embodiment of the present disclosure, and FIG. 4 schematically shows a system according to another embodiment of the present disclosure, wherein the device is established by a robot.

In FIG. 1, a system 10 is shown that comprises several devices 12 that are connected with each other by several cables 14. In the shown embodiment, three devices 12 are connected with each other by five cables 14.

Figure 2:
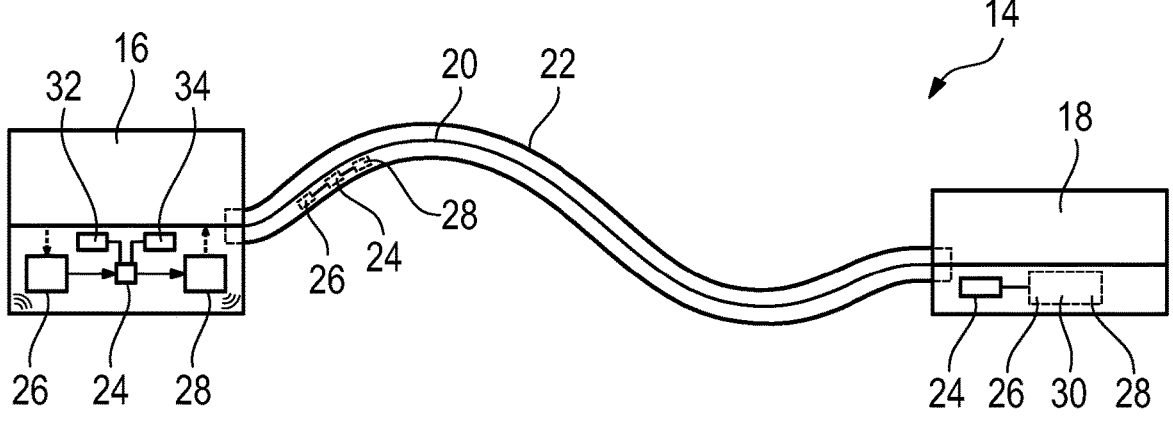

One of the cables 14 used is shown in FIG. 2 in more detail to which reference is made hereinafter. In general, the cable 14 shown in FIG. 2 comprises a first connection interface 16 as well as a second connection interface 18 which are located at ends of the cable 14 and connected with each other by a signal line 20.

In some embodiments, the cable 14 may relate to a radio frequency (RF) cable that is used for forwarding radio frequency signals via the connection interfaces 16, 18 and the signal line 20. In some embodiments, measurement data may be forwarded via the cable 14, for example the signal line 20 and the connection interfaces 16, 18, for instance by radio frequency signals.

Moreover, the cable 14 has a sheath 22 that surrounds the signal line 20 completely. Optionally, the sheath 22 may at least partially surround the first connection interface 16 and the second connection interface 18.

The connection interfaces 16, 18 may be established by connectors, also called plugs, to be connected to sockets that may be provided at a device with which the cable 14 will be connected, for instance one of the devices 12 shown in FIG. 1. Alternatively, the connection interfaces 16, 18 may be established by sockets. Moreover, one of the connection interfaces 16, 18 may be established by a connector, also called plug, whereas the other one of the connection interfaces 16, 18 is established by a socket.

The cable 14 additionally comprises a memory 24 that is integrated within the cable 14. The memory 24 relates to an electronic component integrated within the cable 14, wherein data/information can be stored in the memory 24. In some embodiments, the memory 24 may be an Erasable Programmable Read-Only Memory (EPROM) or an Electrically Erasable Programmable Read-Only Memory (EE-PROM).

In the shown embodiment, the memory 24 is implemented in the first connection interface 16. However, the memory 24 may also be implemented in the second connection interface 18 or in a main portion of the cable 14 that is surrounded by the sheath 22, e.g. next to the signal line 20. The latter alternative is illustrated in FIG. 2 by the dashed lines.

In some embodiments, the memory 24 comprises at least one parameter of the cable 14 itself that provides information/data about a characteristic/property of the cable 14. For instance, the at least one parameter of the cable 14, which is stored in the memory 24, relates to the type of the cable 14, a usable frequency range, a frequency response of the cable 14, an attenuation of the cable 14, an electrical length of the cable 14, a delay a of the cable 14 nd/or a torque to be applied for correctly connecting the cable 14 to a device, for instance one of the devices 12 shown in FIG. 1.

The data/information associated with the at least one parameter stored may be obtained from a specification of the cable 14. Alternatively, the respective parameter was measured, namely obtained by means of measuring the cable 14, e.g. its characteristics/properties.

For inputting the respective data/information associated with the at least one parameter stored in the memory 24, the cable 14 also comprises an input interface 26 that is connected to the memory 24.

Accordingly, a manufacturer of the cable 14 may input the data/information about the at least one parameter via the input interface 26 such that the manufacturer of the cable 14 already provides the data/information about the at least one parameter.

In other words, the input interface 26 is used to input the respective data/information of the at least one parameter to be stored in the memory 24. The data/information may be input once, for instance during the manufacturing of the cable 14. Thus, the data/information about the at least one parameter can be permanently stored in the memory 24.

Alternatively or additionally, a user or operator of the cable 14 may use the input interface 26 in order to input a new parameter or adapt an already existing parameter, for instance due to a measurement performed.

In other words, the data/information about the at least one parameter may be adapted by the input interface 26, for instance after performing a certain measurement of the cable

14 in order to characterize the cable 14, namely its properties. This ensures that deviations, for instance due to the age of the cable 14, can be taken into account appropriately.

Furthermore, the cable 14 also comprises an output interface 28 that is connected to the memory 24. The information/data stored on the memory 24, namely the at least one parameter, can be output via the output interface 28 such that the parameter of the cable 14 can be used by another device, for instance one of the devices 12 shown in FIG. 1.

In other words, the output interface 28 ensures that the respective information/data stored in the memory 24 can be forwarded to a separately formed device, for instance the device 12 connected with the cable 14, which further processes the data/information obtained.

In the shown embodiment, the input interface 26 and the output interface 28 are separately formed interfaces that are integrated in the first connection interface 16. However, the input interface 26 and/or the output interface 28 may also be integrated in the second connection interface 18 or main portion of the cable 14 that is surrounded by the sheath 22, e.g. next to the signal line 20. The latter alternative is illustrated in FIG. 2 by the dashed lines. Generally, the input interface 26 and the output interface 28 may also be distributed within the cable 14.

Alternatively, the cable 14 may have a communication interface 30 that provides the input interface 26 and the output interface 28 simultaneously. For instance, the signal communication interface 30 may include a Near Field Communication interface.

Moreover, the cable 14 may have at least one communication interface 30 that provides an input interface 26 and an output interface 28 simultaneously as indicated by the dashed lines in FIG. 2.

Accordingly, two input interfaces 26 and two output interfaces 28 may be provided, for example at the respective ends of the cable 14, e.g. the connection interfaces 16, 18.

Generally, the at least one parameter may be forwarded via the output interface 28 only upon request by the device connected with the cable 14.

Alternatively or additionally, the data/information about the at least one parameter stored in the memory 24 is output directly once a connection has been established with the cable 14. Thus, the data/information is automatically provided that can be used for automatically configuring the device connected with the cable 14, e.g. one of the devices 12 shown in FIG. 1.

In addition, the cable 14 has a sensor 32 that is capable of sensing an environmental parameter of the cable 14, for instance temperature, humidity, air pressure, particle radiation or strain. Based on the environmental parameter sensed, the value to be output of the at least one parameter may deviate.

In other words, the at least one parameter is environmental-dependent such that several values for the at least one parameter are stored in the memory 24, wherein the values depend on the value of the environmental parameter. Alternatively, a functional relationship between the at least one parameter and the environmental parameter is stored in the memory 24 such that a certain value of the at least one parameter is obtained in dependency of the environmental parameter sensed.

In addition, the cable 14 may also comprise a counter 34 that is capable of counting the number of connections established with the cable 14. The respective information may also be stored in the memory 24, wherein this information can be forwarded via the output interface 28 in order to inform the device connected with the cable 14 about the quality of the cable 14.

Generally, the input interface 26, the output interface 28 and/or the communication interface 30 may be a wired interface or a wireless interface, for example an interface separately formed with respect to the connection interfaces 16, 18.

Alternatively or additionally, the input interface 26, the output interface 28 and/or the communication interface 30 may be configured to transfer the at least one parameter at least partially via the signal line 20, for instance by modulating a (radio frequency) signal forwarded via the signal line 20. Accordingly, the data/information about the at least one parameter can be transferred on the same signal line 20 and via the connection interfaces 16, 18 by modulating the data of the at least one parameter with the measurement data that is typically transferred with the radio frequency (RF) signal via the signal line 20.

Figure 3:
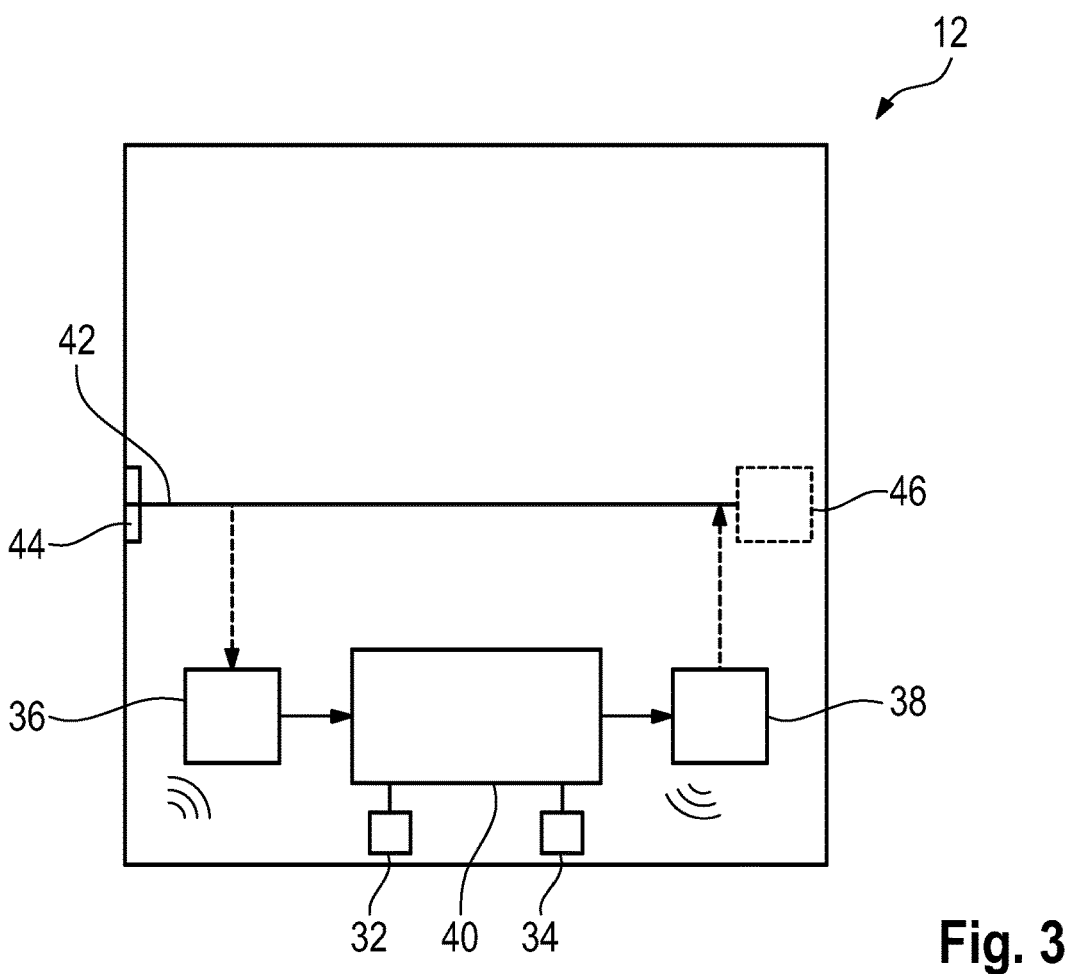

Generally and as shown in FIG. 3, at least one of the devices 12 that is connected with the cable 14 may also comprise the respective components, namely an input interface 36, an output interface 38 and a memory 40. Further, the device 12 may also comprise the sensor 32 or the counter 34 such that the environmental parameter of the device 12 and/or the number of connections established with the device 12 can be obtained.

Therefore, the respective information about the cable 14 may also be stored in the device 12 that is connected to the cable 14, namely its memory 40. Alternatively or additionally, data/information about at least one parameter of the device 12 may be stored in the memory 40 of the device 12.

In some embodiments, the respective device 12 may be a passive device like a splitter, a measurement bridge, a combiner, a filter, a directional coupler, a diplexer, a duplexer, a multiplexer, a switch, a reflector, a phase shifter or a waveguide.

In any case, the device 12 may have a signal line 42 located between a signal processing interface 44 to which the cable 14 can be connected and another signal processing interface 46.

Such a passive device 12, e.g. a device 12 having two signal processing interfaces 44, 48, may have its own properties when processing a (RF) signal. Accordingly, at least one parameter associated with at least one of the properties may be stored within the device 12.

Generally, the memory 40 of the device 12 is capable of storing at least one parameter of the cable 14 and/or the device 12, which is input via the input interface 36, and wherein the output interface 38 is capable of accessing the at least one parameter stored in the memory 40 and outputting the at least one parameter.

The system 10 however may also comprise a specific device 12 that is established by a processing device 48 or an active device 48 having one or more circuits, for instance a test and measurement instrument. Such device 48 may use the information/data of the cable 14 or the device 12 in order to configure an internal setting based on the at least one parameter, namely the at least one parameter of the cable 14 and/or the at least one parameter of the device 12.

For instance, the device 48 may comprise a smart connector 50 to which the cable 14 is connected. The smart connector 50 may have an interface 52 via which the device 48 is capable of obtaining the at least one parameter of the cable 14. Accordingly, the interface 52 may communicate with the output interface 28 of the cable 14 connected thereto.

As mentioned above, the data/information associated with the at least one parameter of the cable 14 may be automatically forwarded to the output interface 28 in case it is recognized that the cable 14 has been connected to the device 48. Thus, an automatic transfer of the data/information about the at least one parameter is provided.

Alternatively, the interface 52 is a read-out interface 54 that is capable of accessing the memory 24 via the output interface 28. Thus, the device 48 reads out the memory 24 of the cable 14 in order to access the information/data about the at least one parameter.

The device 48 is generally capable of configuring its internal setting based on the at least one parameter of the cable 14 in order to self-configure the entire system 10.

Generally, the device 48 may also be connected to one of the devices 12 having the integrated memory 40 such that the data/information associated with the parameter of the device 12 may also be obtained and used for self-configuration.

As shown in FIG. 1, the different devices 12, 48 and/or cables 14 of the system 10 are connected with each other in series and/or in parallel such that measurement data can be forwarded among the components of the system 10 via their signal lines 20, 42.

Generally, the output interface 28 of a device 12 or cable 14 may forward information/data about the at least one parameter stored in its memory 24, 40 to an adjacent device 12 or cable 14, which connected to the output interface 28 via its input interface 26. The adjacent device 12 or cable 14 may store the information/data about the at least one parameter obtained via its input interface 28. Accordingly, in the memory 24, 40 information about its own properties as well as properties of adjacent devices 12 or cables 14 may be stored. Therefore, a data/information transfer chain is established via the input interfaces 26, the output interfaces 28 and/or the communication interfaces 30 of the devices 12, 48 and/or cables 14 of the system 10.

Figure 4:
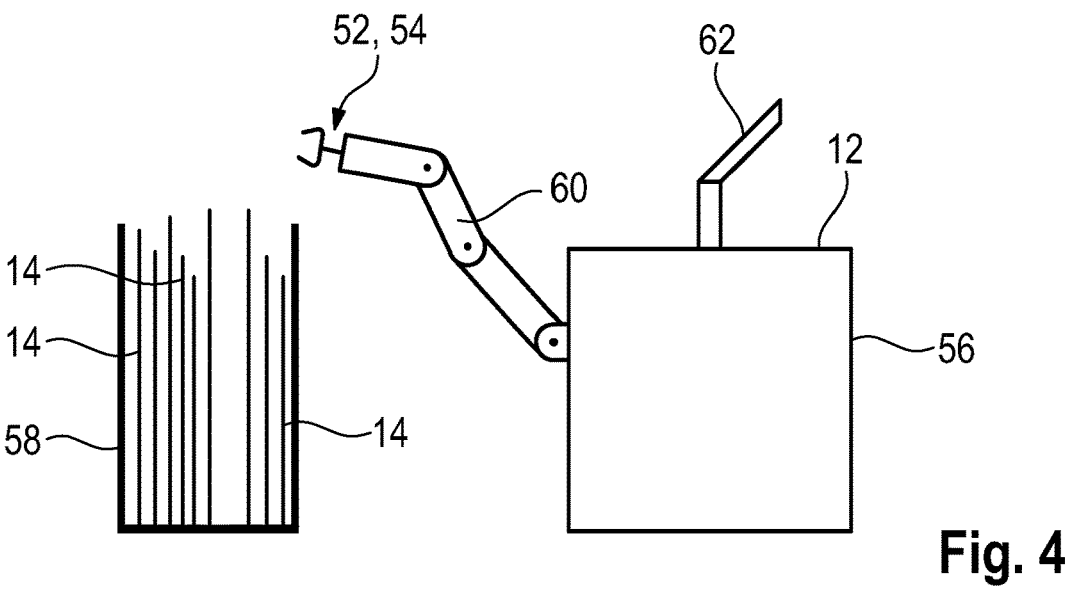

In a specific embodiment shown in FIG. 4, one of the devices 12 may relate to a robot 56 that is capable of automatically identifying a correct cable 14 due to the fact that the robot 56 is able to automatically connect with the output interface 28 of the cable 14 in order to obtain the information/data of the at least one parameter of the cable 14, thereby identifying the cable 14.

The system 10 may comprise a magazine 58 that comprises several cables 14. The robot 56 is enabled to identify the cables 14 by obtaining the information/data of the parameters of the cables 14.

Hence, the robot 56 may have the interface 52 that communicates with the output interface 28 of the cable 14, for instance associated with a robot arm 60. The interface 52 may be established by a read-out interface 54 that is capable of accessing the memory 24 of the cable 14 via the output interface 28. Thus, the robot 56 is enabled to read out the memories 24 of the cables 14 in order to access the respective information/data.

Additionally, the robot 56 has a torque wrench 62 that is capable of matching a torque based on the at least one parameter of the cable 14 obtained. For instance, the parameter obtained relates to a torque to be applied for establishing the connection with the cable 14 correctly.

Therefore, the robot 56 is enabled to identify whether established connections are made correctly and, additionally, the robot 56 is enabled to adapt the torque applied to ensure that the specified torque is obtained.

Certain embodiments disclosed herein include components that may utilize circuitry (e.g., one or more circuits) in order to implement protocols, methodologies or technologies disclosed herein, operably couple two or more components, generate information, process information, analyze information, generate signals, encode/decode signals, convert signals, transmit and/or receive signals, control other devices, etc. Circuitry of any type can be used. It will be appreciated that the term "information" can be use synonymously with the term "signals" in this paragraph. It will be further appreciated that the terms "circuitry," "circuit," "one or more circuits," etc., can be used synonymously herein.

In an embodiment, circuitry includes, among other things, one or more computing devices such as a processor (e.g., a microprocessor), a central processing unit (CPU), a digital signal processor (DSP), an application-specific integrated circuit (ASIC), a field programmable gate array (FPGA), a system on a chip (SoC), or the like, or any combinations thereof, and can include discrete digital or analog circuit elements or electronics, or combinations thereof.

In an embodiment, circuitry includes hardware circuit implementations (e.g., implementations in analog circuitry, implementations in digital circuitry, and the like, and combinations thereof). In an embodiment, circuitry includes a memory. In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes an implementation comprising one or more processors or portions thereof and accompanying software, firmware, hardware, and the like.

In the foregoing description, specific details are set forth to provide a thorough understanding of representative embodiments of the present disclosure. It will be apparent to one skilled in the art, however, that the embodiments disclosed herein may be practiced without embodying all of the specific details. In some instances, well-known process steps have not been described in detail in order not to unnecessarily obscure various aspects of the present disclosure. Further, it will be appreciated that embodiments of the present disclosure may employ any combination of features described herein.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

Throughout this specification, terms of art may be used. These terms are to take on their ordinary meaning in the art from which they come, unless specifically defined herein or the context of their use would clearly suggest otherwise.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A radio frequency (RF) cable for being connected to a device, the cable comprising:

a memory configured to store at least one parameter of the cable;

an input interface connected to the memory and configured to input the at least one parameter stored in the memory;

an output interface connected to the memory, the output interface configured to access the at least one parameter stored in the memory and to output the at least one parameter;

a first connection interface and a second connection interface connected to each other by a signal line, the input interface and the output interface being established by a single wireless communication interface, wherein measurement data or information is forwarded via the signal line and the connection interfaces by radio frequency signals, and wherein information about the at least one parameter can be adapted by the input interface such that deviations due to the age of the cable can be taken into account.

* * * * *